United States Patent
Ganz et al.

(10) Patent No.: US 10,813,239 B2
(45) Date of Patent: Oct. 20, 2020

(54) COOLING ARRANGEMENT

(71) Applicant: Mahle International GmbH, Stuttgart (DE)

(72) Inventors: Matthias Ganz, Stuttgart (DE); Jessica Kansy, Stuttgart (DE); Thomas Kalmbach, Stuttgart (DE); Michael Trebbe, Stuttgart (DE)

(73) Assignee: MAHLE INTERNATIONAL GMBH (DE)

( * ) Notice: Subject to any disclaimer, the term of this patent is extended or adjusted under 35 U.S.C. 154(b) by 0 days.

(21) Appl. No.: 16/509,298

(22) Filed: Jul. 11, 2019

(65) Prior Publication Data

US 2020/0029452 A1 Jan. 23, 2020

(30) Foreign Application Priority Data

Jul. 12, 2018 (DE) .................. 10 2018 211 666

(51) Int. Cl.
*H05K 7/20* (2006.01)
*H05K 5/06* (2006.01)
*F28F 13/12* (2006.01)

(52) U.S. Cl.
CPC ............ *H05K 5/067* (2013.01); *F28F 13/12* (2013.01); *H05K 7/203* (2013.01); *H05K 7/20236* (2013.01); *H05K 7/20927* (2013.01); *H05K 7/20936* (2013.01)

(58) Field of Classification Search
CPC .... H05K 7/067; H05K 7/20236; H05K 7/203; H05K 7/20927; H05K 7/20936; F28F 13/12
See application file for complete search history.

(56) References Cited

U.S. PATENT DOCUMENTS

| 4,572,286 A | 2/1986 | Fujii et al. |
| 4,957,157 A * | 9/1990 | Dowdy .................. B64G 1/50 165/104.26 |
| 5,195,577 A | 3/1993 | Kameda et al. |
| 6,586,674 B2 | 7/2003 | Krause et al. |
| 2017/0064862 A1 * | 3/2017 | Miyoshi ............ H01L 21/67109 |
| 2017/0127556 A1 * | 5/2017 | Smith .................... H05K 5/068 |
| 2017/0290198 A1 * | 10/2017 | Shepard ............ H05K 7/20236 |
| 2017/0303434 A1 * | 10/2017 | Katsumata .............. H01L 23/44 |
| 2019/0052146 A1 * | 2/2019 | Decaux ............. H05K 7/20918 |

FOREIGN PATENT DOCUMENTS

| DE | 3026881 A1 | 2/1982 |
| DE | 20020270 U1 | 3/2001 |

OTHER PUBLICATIONS

Engllish abstract for DE-3026881.

* cited by examiner

*Primary Examiner* — Jacob R Crum
(74) *Attorney, Agent, or Firm* — Fishman Stewart PLLC

(57) ABSTRACT

A cooling arrangement may include a fluid-tight housing in which a power electronics system and a dielectric fluid for cooling the power electronics system may be arranged. The dielectric fluid may be in heat-transferring contact with the power electronics system and may cool the power electronics system via a fluid movement. The fluid movement may be provided via acceleration forces acting on the cooling arrangement.

20 Claims, 2 Drawing Sheets

COOLING ARRANGEMENT

CROSS-REFERENCE TO RELATED APPLICATIONS

This application claims priority to German Patent Application No. DE 10 2018 211 666.0, filed on Jul. 12, 2018, the contents of which are hereby incorporated by reference in its entirety.

TECHNICAL FIELD

The present invention relates to a cooling arrangement comprising a fluid-tight housing. The invention also relates to a motor vehicle comprising a cooling arrangement of this kind.

BACKGROUND

One limiting factor when operating a power electronics system is a maximum permissible operating temperature. In a first approximation, this is dependent on the electric current flow, for which reason the power electronics system for electrically operated motor vehicles is usually cooled. Cooling of this kind is even advantageous in order to be able to protect the electrical components, primarily the power semiconductors, such as transistors for example, against damage and breakdown due to overheating. In addition, by virtue of cooling of this kind, the power density can also be increased since the power electronics system and, respectively, the components thereof can be designed to be smaller, this in turn having an advantageous effect on the costs and also the weight and the installation space required.

Direct cooling or indirect cooling can be used in order to cool the power electronics system, wherein, in the case of direct cooling, a dielectric fluid is usually in direct contact with the power electronics system to be cooled, that is to say in general with the heat source to be cooled. The thermal resistance of the heat-transferring section can be kept low and efficient in this way. Furthermore, the use of a dielectric fluid of this kind for cooling the power electronics system usually requires a dedicated fluid circuit together with the conventional components, such as pump, filters and valves for example, required for it.

In the case of the indirect cooling however, a separate heat exchanger, for example a cooling plate, fitted to the object of which the temperature is to be controlled, that is to say to the power electronics system here. Since the cooling fluid flows from the heat source in an electrically and spatially isolated manner, for example through a pipe wall, electrically conductive fluids, such as a water/glycol mixture for example, can also be used here, this being clearly better suited for cooling in respect of its material properties (for example thermal conductivity and thermal capacity). Since a large number of motor vehicles already have a low-temperature circuit, it is only necessary to add a few components to the circuit for this purpose. However, indirect cooling of this kind has the disadvantage of the comparatively high thermal resistance in the heat-transferring section and also the connection of the heat exchanger.

SUMMARY

The present invention therefore addresses the problem of specifying an improved embodiment for a cooling arrangement, which embodiment overcomes the disadvantages known from the prior art in particular.

According to the invention, this problem is solved by the subject matter of the independent claim(s). Advantageous embodiments are the subject matter of the dependent claim(s).

The present invention is based on the general idea of cooling a power electronics system by means of a dielectric fluid and slosh cooling. To this end, the cooling arrangement according to the invention has a fluid-tight housing in which a power electronics system and a dielectric fluid for cooling the power electronics system are arranged, wherein the dielectric fluid is in heat-transferring contact with the power electronics system and cools the said power electronics system by means of a fluid movement (slosh cooling) which is induced by acceleration forces which act on the cooling arrangement. In this case, "slosh" and, respectively, "slosh cooling" are intended to be understood to mean that any movement in the fluid which is caused in whatever way by a vehicle movement or a change in the said vehicle movement is covered by the said terms. This means that the said terms are intended to be understood to cover not only a rapid acceleration of dielectric fluid with subsequent crashing but rather, for example, also a slow back-and-forth movement of the fluid. This provides the major advantage that heat can be directly dissipated from the power electronics system to the dielectric fluid and from the said dielectric fluid, via the housing, into the surrounding area, as a result of which a short heat-transferring section with a low thermal resistance can be achieved. In this case, the sloshing movement is achieved by a movement of the cooling arrangement, for example in a motor vehicle, so that, in the most favourable case, no further conveying components, such as a pump for example, are required and the power electronics system can be cooled in a structurally simple, effective and cost-efficient manner.

In one advantageous development of the solution according to the invention, provision is made for combining direct cooling with indirect cooling and for directly cooling the power electronics system by means of the dielectric fluid by means of direct cooling, while the dielectric fluid is cooled by means of, for example, a vehicle radiator using indirect cooling. As a result, the heat-transferring section and therefore the thermal resistance between the power electronics system to be cooled and the dielectric fluid can be kept extremely small, while a vehicle radiator which is usually present in a motor vehicle in any case and which cools the dielectric fluid by means of a first heat exchanger can be used for cooling the dielectric fluid. In this case, this first heat exchanger constitutes the connecting element between direct cooling and indirect cooling. The dielectric fluid is connected in a heat-transferring manner to the power electronics system and to the first heat exchanger and washes around the said power electronics system and, respectively, the said first heat exchanger. In this case, the cooling arrangement according to the invention has a cooling fluid circuit in which the first heat exchanger and a second heat exchanger, which is arranged externally to the housing, that is to say outside the said housing, and also a cooling fluid pump are arranged. In this case, the first heat exchanger serves for cooling the dielectric fluid, while the second heat exchanger is designed for cooling the cooling fluid. This embodiment of the cooling arrangement furthermore provides the major advantage that a fluid other than that in the cooling fluid circuit (secondary fluid) can be used for the dielectric fluid (primary fluid), so that a known and proven water/glycol mixture can be used in the cooling fluid circuit for example. The said water/glycol mixture is cooled by the second heat exchanger, which is designed as a cooling fluid radiator of an internal combustion engine of a motor vehicle for example, and in turn cools the dielectric fluid by means of the first heat exchanger. The dielectric fluid which is cooled by the first heat exchanger cools the power electronics system by means of slosh cooling, wherein the dielectric fluid sloshes back and forth in the housing, preferably without further conveying components, for example on account of a vehicle movement, so that dielectric fluid washes around and cools the power electronics system simply owing to the surging or sloshing movement of the dielectric fluid which occurs during driving of the motor vehicle. Therefore, with this embodiment of the cooling arrangement according to the invention, it is possible to use indirect cooling, which has been known to date in any case, for cooling a dielectric fluid and to provide direct cooling, which functions at a low thermal resistance, for the power electronics system by means of the said dielectric fluid. In addition, a comparatively low quantity of fluid is also sufficient for the dielectric fluid in the housing, as a result of which costs and weight can be saved.

In one advantageous development of the solution according to the invention, the first heat exchanger is arranged at a low, preferably the lowest, point of the housing. This can ensure that the dielectric fluid mostly wets the first heat exchanger and is cooled by the said first heat exchanger, as a result of which the cooling performance can be considerably increased.

In a further advantageous embodiment of the solution according to the invention, the dielectric fluid and/or the cooling fluid can be designed with a single phase or multiple phases. Multiple-phase refrigerants can be, for example, $CO_2$ or 1234yf. The multiple-phase dielectric fluids used can be, for example, hydrofluoroether heat-transfer fluids.

In a further advantageous embodiment of the solution according to the invention, at least one guiding element for guiding the dielectric fluid is arranged in the housing. A guiding element of this kind can have, for example, a surge- or slosh-promoting geometry and as a result, given a natural movement of a motor vehicle, cause or at least assist guiding of the dielectric fluid to points, which are to be cooled, of the power electronics system. Guiding elements of this kind can have, for example, a triangular, an arcuate, a corrugated, a spoiler-like, a trapezoidal or else a different form or geometry and are intended to serve merely to further direct the surge or slosh movement, which is caused by the vehicle movement in any case, to points, which are to be cooled in particular, of the power electronics system.

Expediently, the at least one guiding element is designed as a separate component or is integrally formed with the housing. In this case, the last-mentioned variant particularly has the major advantage that no additional assembly of the at least one guiding element has to be performed in the housing, but rather the said guiding element is produced directly at the same time as the housing is produced, for example by way of a corresponding curvature or shaping in a housing wall. In addition or as an alternative, it goes without saying that separate guiding elements which further direct or guide the dielectric fluid to the power electronics system can also be provided.

In a further advantageous embodiment of the solution according to the invention, the at least one guiding element has a channel structure with at least one outlet opening, in particular a nozzle, which is directed at a point of the power electronics system to be cooled. A guiding element of this kind can therefore use the sloshing or surging movement of the dielectric fluid which occurs during driving of the motor vehicle in order to convey the dielectric fluid to a higher level and/or however to convey the said dielectric fluid entirely deliberately to specific points of the power electronics system through corresponding outlet openings or nozzles. In this case, a guiding element of this kind can have a bent or a straight channel, wherein an inflow opening to the channel or to the channel structure is usually situated below a level of the dielectric fluid, as a result of which a continuous supply of dielectric fluid into the channel structure of the guiding element can be ensured.

In a further advantageous embodiment of the solution according to the invention, the power electronics system is arranged at least partially below the level of the dielectric fluid. Extremely reliable and effective cooling of the power electronics system can be achieved in this way too.

In addition, a pump for distributing the dielectric fluid and/or for directly injecting or spraying dielectric fluid onto the power electronics system can expediently be provided in the housing. If, for example, it is assumed that the natural surging or sloshing movement of the dielectric fluid is not sufficient for cooling the power electronics system, the dielectric fluid can additionally be further guided to a specific point, which is in particular also difficult to access by a natural surging or sloshing movement, by means of the above-described pump.

The present invention is further based on the general idea of equipping a motor vehicle with an above-described cooling arrangement, wherein the second heat exchanger can be, for example, a cooling fluid radiator of an internal combustion engine. In particular, modern hybrid or electric vehicles can be particularly effectively cooled in this way.

Further important features and advantages of the invention can be found in the dependent claims, in the drawings and in the associated description of figures with reference to the drawings.

It goes without saying that the features cited above and those yet to be explained below can be used not only in the respectively indicated combination but also in other combinations or on their own without departing from the scope of the present invention.

Preferred exemplary embodiments of the invention are illustrated in the drawings and will be explained in more detail in the following description, wherein identical reference symbols relate to identical or similar or functionally identical components.

BRIEF DESCRIPTION OF THE DRAWINGS

In the drawings, in each case schematically.

DETAILED DESCRIPTION

Figure 1:
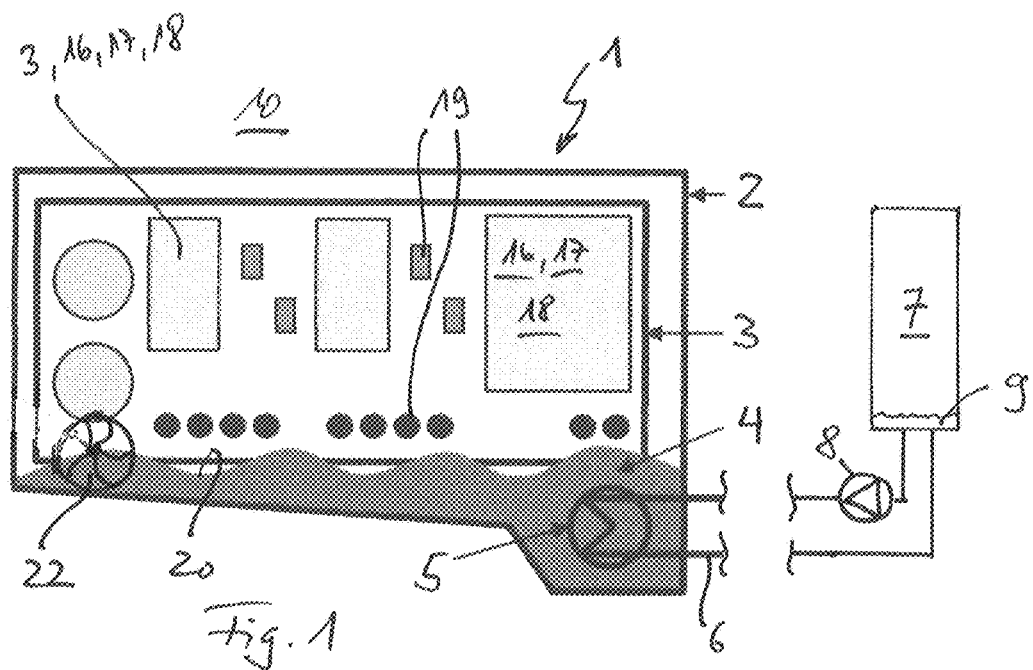
FIG. 1 shows a sectional illustration through a cooling arrangement according to the invention.

In accordance with FIGS. 1 to 4, a cooling arrangement 1 according to the invention has a fluid-tight housing 2 in which a power electronics system 3 and a dielectric fluid 4 for cooling the power electronics system 3 are arranged, wherein the dielectric fluid 4 is in heat-transferring contact with the power electronics system 3 and cools the said power electronics system by means of slosh cooling. In this case, "slosh cooling" is intended to be understood to mean that any movement in the fluid 4 which is caused in whatever way by a vehicle movement or a change in the said vehicle movement is covered by the said term. This means that the said term is intended to be understood to cover not only a rapid acceleration of dielectric fluid 4 with subsequent crashing but rather, for example, also a slow back-and-forth movement of the fluid 4. This provides the major advantage that heat can be directly dissipated from the power electronics system 3 to the dielectric fluid 4 and from the said dielectric fluid, via the housing 2, into the surrounding area, as a result of which a short heat-transferring section with a low thermal resistance can be achieved. In this case, the sloshing movement is achieved by a movement of the cooling arrangement 1, for example in a motor vehicle 10, so that, in the most favourable case, no further conveying components, such as a pump 21 for example, are required and the power electronics system 3 can be cooled in a structurally simple, effective and cost-efficient manner.

In addition, a first heat exchanger 5 can be arranged in the housing 2. In this case, the dielectric fluid 4 is connected in a heat-transferring manner both firstly to the power electronics system 3 and also secondly to the first heat exchanger 5 and preferably at least partially washes around the power electronics system 3 and the first heat exchanger 5. Furthermore, a cooling fluid circuit 6 (only shown in FIG. 1) can be provided, in which cooling fluid circuit the first heat exchanger 5 and a second heat exchanger 7, which is arranged externally to the housing 2, and also a cooling fluid pump 8 are arranged. In this case, the first heat exchanger 5 is designed for cooling the dielectric fluid 4, while the second heat exchanger 7 (for example a cooling fluid radiator or chiller) is designed for cooling a cooling fluid 9 which flows in the cooling fluid circuit 6. In this case, the cooling arrangement 1 according to the invention connects direct cooling, specifically direct cooling of the power electronics system 3 by the dielectric fluid 4, to indirect cooling, specifically cooling of the dielectric fluid 4 by the first heat exchanger 5 which transfers thermal energy originating from the power electronics system 3 to the cooling fluid 9 which flows in the cooling fluid circuit 6 and, for its part, is in turn cooled in the second heat exchanger 7.

Owing to the direct cooling of the power electronics system 3 by means of the dielectric fluid 4, a thermal resistance of a heat-transferring section can be kept extremely low and as a result cooling can be extremely efficient. In addition, it is possible to use the cooling arrangement 1 according to the invention to cool the dielectric fluid 4 by means of the second heat exchanger 7 since the said second heat exchanger cools the first heat exchanger 5 and furthermore the dielectric fluid 4 by means of the cooling fluid 9. In this case, the second heat exchanger 7 can be a conventional cooling fluid radiator of an internal combustion engine. In this case, the power electronics system 3 is cooled by means of the dielectric fluid 4, preferably without further components, such as pumps for example, that is to say only by the dielectric fluid 4 sloshing back and forth or surging in the housing 2, in a manner caused, for example, by driving movements of a motor vehicle 10 which can be designed, for example, as an electric vehicle, as a hybrid vehicle or as a conventional motor vehicle with an internal combustion engine. The major advantage of this embodiment of the cooling arrangement 1 is therefore that a second heat exchanger 7 which up until now is present in the motor vehicle 10 in any case, that is to say a cooling fluid radiator, can be used for additionally cooling the power electronics system 3, without having to entirely resort to the indirect cooling used up until now, since indirect cooling of this kind by means of, for example, cooling plates which bear against the power electronics system 3 has a high thermal resistance of the heat-transferring section and therefore a comparatively low efficiency.

Still looking at FIG. 1, it can be seen that the first heat exchanger 5 is arranged at the lowest point of the housing 2, so that, independently of operation, it is always ensured that the dielectric fluid 4 washes around the first heat exchanger 5 and as a result the dielectric fluid 4 can be cooled by the first heat exchanger 5.

The dielectric fluid 4 and/or the cooling fluid 9 can be designed with a single phase or multiple phases, so that a water/glycol mixture can be used for the cooling fluid 9, which water/glycol mixture ensures both optimum heat transfer and also mixture-dependent protection against freezing. Multiple-phase refrigerants (cooling fluid 9) can be, for example, $CO_2$ or 1234yf. The multiple-phase dielectric fluids 4 used can be, for example, hydrofluoroether heat-transfer fluids.

Figure 2:
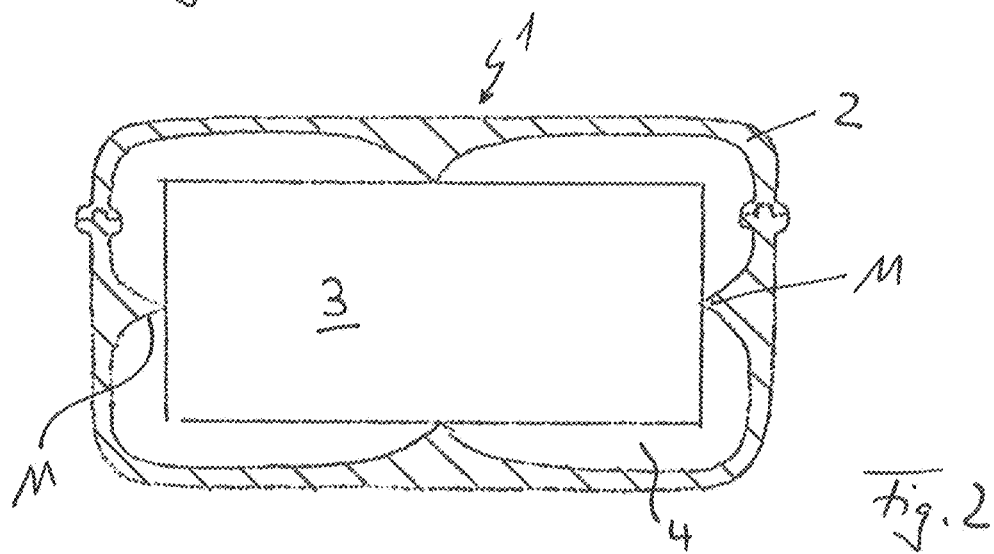
FIG. 2 shows a plan view of a cooling arrangement according to the invention with a sectioned housing.
Figure 3:
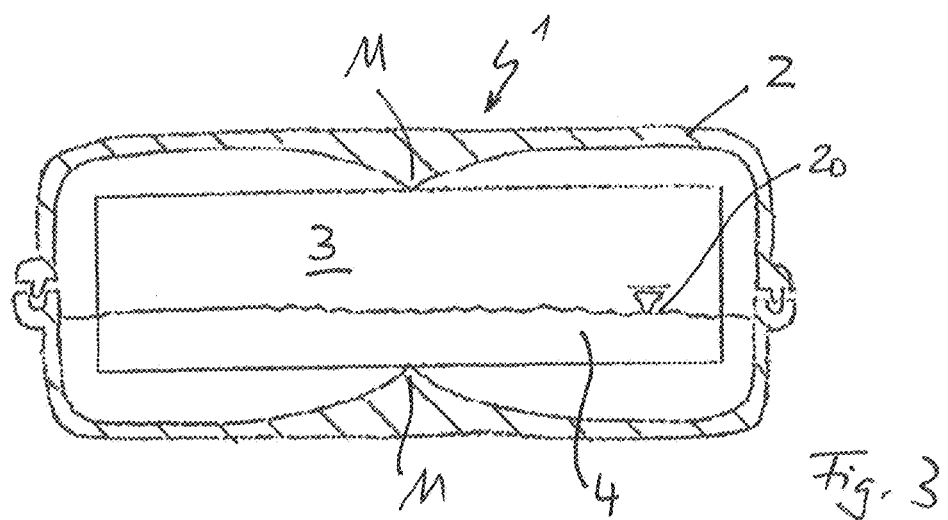
FIG. 3 shows a sectional illustration of a cooling arrangement according to the invention from the side.

Looking at FIGS. 2 and 3 and also 5A to 5C, it can be seen that at least one guiding element 11 for guiding the dielectric fluid 4 is arranged in the housing 2. In this case, the guiding element 11 or the guiding elements 11 cause a predefined deflection of the dielectric fluid 4, in particular to points of the power electronics system 3 which are to be cooled in particular, during driving of the motor vehicle 10. In order to be able to render the deflection or guiding of the fluid 4 possible, the at least one guiding element 11 has a surge or slosh-promoting geometry, as is shown according to FIGS. 2 and 3 by way of example. In this case, the at least one guiding element 11 can be designed as a separate component, as is shown according to FIGS. 5A to 5C, or else can be integrally formed with the housing 2, as is shown according to FIGS. 2 and 3 for example. The latter provides the major advantage that the guiding elements 11 can be produced together with the housing 2 and as a result a subsequent, separate assembly step for installing the guiding elements 11 into the housing 2 can be dispensed with. It goes without saying that a combination of guiding elements 11 which are integrated into the housing 2 with guiding elements 11 which are installed separately is also conceivable.

Figure 5A:
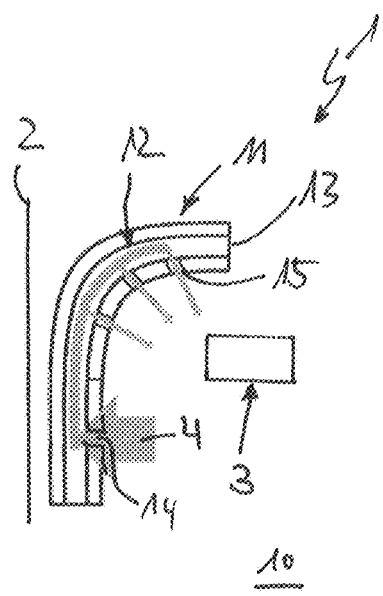
FIGS. 5A through 5C show different sections through guiding elements which are provided in the cooling arrangement according to the invention.
Figure 5B:
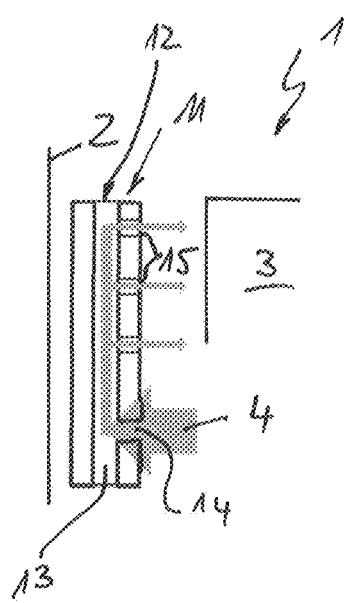
Figure 5C:
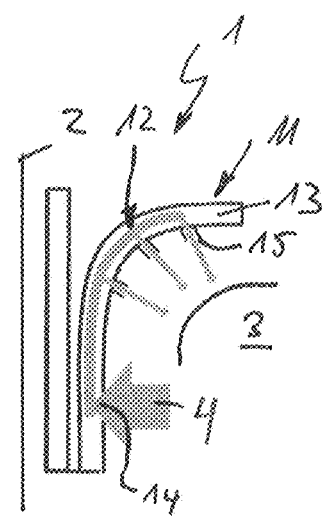

Looking at the guiding elements 11 according to FIGS. 5A to 5C, it can be seen that the said guiding elements each have a channel structure 12 with a channel 13, wherein the channel 13 has at least one inlet opening 14 and at least one outlet opening 15, in particular in the form of a nozzle, which is directed at a point of the power electronics system 3 to be cooled. In this case, the inlet opening 14 is arranged in such a way that dielectric fluid can act on it during normal sloshing of the dielectric fluid 4 back and forth during driving of the motor vehicle 10, wherein a level is passed by a sloshing movement of this kind owing to the indicated guiding elements 11 and the dielectric fluid 4 can also be moved to higher points of the power electronics system 3. Therefore, in the present case, the at least one inlet opening 14 is arranged below the at least one outlet opening 15.

In relation to the power electronics system 3, it should be noted that it can have an extremely wide variety of components, such as power semiconductors, a metal-oxide-semiconductor field-effect transistor (MosFET) 16, a bipolar transistor with an insulated gate electrode (IGBT) 17 for example, or other electronic parts, such as printed circuits 18 or switches 19 for example.

Looking at FIG. 1 and also 3 and 4, it can be seen that the power electronics system 3 is arranged at least partially below a level 20 of the dielectric fluid 4 and as a result dielectric fluid 4 always washes around and cools the said power electronics system.

Figure 4:
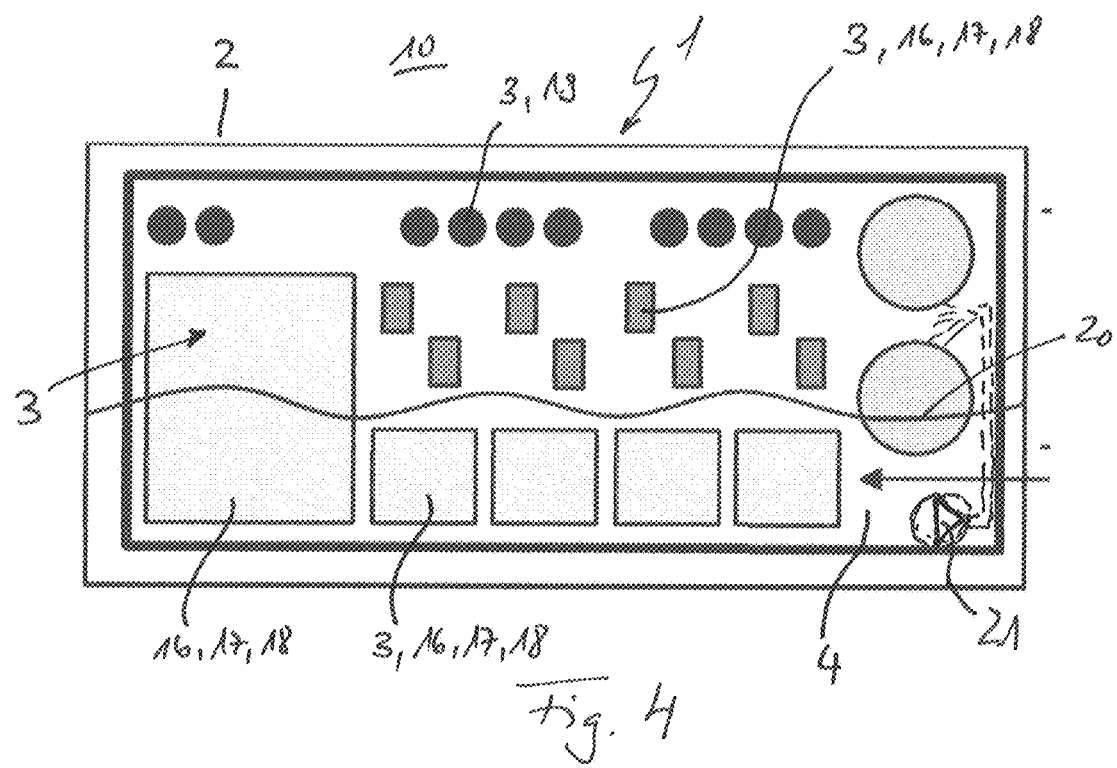
FIG. 4 shows a further possible embodiment of the cooling arrangement according to the invention.

In the exemplary embodiments of the cooling arrangement 1 according to the invention shown according to FIGS. 1 and 4, the fluid 4 moves in the housing 2, which is closed in a fluid-tight manner, of the cooling arrangement 1 without additional components, such as a fluid pump for example, that is to say solely on account of the driving-related surging and sloshing movements, wherein, in addition or as an alternative, it goes without saying that it is also conceivable for a fluid pump 21 for distributing the dielectric fluid 4 and/or for directly injecting or spraying dielectric fluid 4 onto the power electronics system 3 to be provided in the housing 2. According to FIG. 4, a fluid pump 21 of this kind is indicated using a dashed line since this is not usually provided.

In addition or as an alternative, a conveying device 22, such as a swirling wheel for example, for thoroughly mixing the dielectric fluid 4 and/or for directly injecting or spraying dielectric fluid 4 onto the power electronics system 3 can be arranged in the housing 2. In this case, the conveying device 22 can be arranged both completely below and also merely partially below the level 20 of the dielectric fluid 4. In the case of a swirling wheel, this can also cause either only mixing of the fluid 4 or else also direct injection of dielectric fluid onto the power electronics system, depending on the rotation rate. In this case, the rotation speed could be subjected to open-loop control/closed-loop control by means of a corresponding open-loop control/closed-loop control device in line with the required cooling performance.

Particularly effective but nevertheless structurally simple cooling of the power electronics system 3 can be achieved using the cooling arrangement 1 according to the invention.

On account of the closed housing 2, the quantity of dielectric fluid 4 required is also comparatively low, as a result of which savings in respect of material and weight can be achieved. In particular, depending on the variant, an additional fluid pump 21 for conveying the dielectric fluid 4 can be entirely dispensed with since the movement of the fluid 4 is caused solely by the movements of the motor vehicle 10 during driving.

In particular, movement of the fluid 4 should not be caused by convection or by boiling the fluid 4, as is described in DE 200 20 270 U1 for example, but rather solely by the accelerations which occur during driving of the motor vehicle 10, for example during braking, when driving around a bend or during start-up. A pump 21 can be provided only if required in order to ensure adequate circulation of the fluid 4 when the motor vehicle 10 is at a standstill for a relatively long time during which there is no actual sloshing movement. However, a needs-based pump of this kind can be dimensioned to be relatively small and therefore more cost-efficient and is switched on only if required.

The invention claimed is:

1. A cooling arrangement, comprising:
a fluid-tight housing in which a power electronics system and a dielectric fluid for cooling the power electronics system are arranged;
wherein the dielectric fluid is in heat-transferring contact with the power electronics system and cools the power electronics system via a sloshing fluid movement of the dielectric fluid, which is provided via acceleration forces acting on the housing of the cooling arrangement.

2. The cooling arrangement according to claim 1, further comprising:
a first heat exchanger arranged in the housing;
the dielectric fluid in heat-transferring contact with the first heat exchanger;
a cooling fluid circuit in which the first heat exchanger, a second heat exchanger arranged externally to the housing, and a cooling fluid pump are arranged; and
wherein the first heat exchanger is structured and arranged to cool the dielectric fluid and the second heat exchanger is structured and arranged to cool a cooling fluid which flows in the cooling fluid circuit.

3. The cooling arrangement according to claim 2, wherein the first heat exchanger is arranged at a low point of the housing.

4. The cooling arrangement according claim 2, wherein at least one of the dielectric fluid and the cooling fluid has a single phase.

5. The cooling arrangement according claim 2, further comprising at least one guiding element arranged in the housing to deflect the dielectric fluid.

6. The cooling arrangement according to claim 5, wherein at least one of:
the at least one guiding element has at least one of a surge-promoting geometry and a slosh-promoting geometry; and
the at least one guiding element is one of i) a separate component from the housing and ii) integrally provided with the housing.

7. The cooling arrangement according to claim 5, wherein the at least one guiding element includes a channel structure with at least one inlet opening, and at least one outlet opening directed at a point of the power electronics system to be cooled.

8. The cooling arrangement according to claim 1, wherein the power electronics system includes a power semiconductor.

9. The cooling arrangement according to claim 1, wherein the power electronics system is arranged at least partially below a level of the dielectric fluid.

10. The cooling arrangement according to claim 1, further comprising a fluid pump arranged in the housing configured to at least one of distribute the dielectric fluid, directly inject the dielectric fluid onto the power electronics system, and directly spray the dielectric fluid onto the power electronics system.

11. The cooling arrangement according to claim 1, further comprising a conveying device arranged in the housing configured to at least one of thoroughly mix the dielectric fluid, directly inject the dielectric fluid onto the power electronics system, and directly spray the dielectric fluid onto the power electronics system.

12. A motor vehicle, comprising:
a cooling arrangement including:
a fluid-tight housing in which a power electronics system and a dielectric fluid for cooling the power electronics system are arranged;
the dielectric fluid in heat-transferring contact with the power electronics system and cooling the power electronics system via a sloshing fluid movement of the dielectric fluid, which is provided via acceleration forces acting on the housing of the cooling arrangement;
an internal combustion engine;
a cooling fluid circuit in which a first heat exchanger, a second heat exchanger, and a cooling fluid pump are arranged, the first heat exchanger arranged in the housing, the second heat exchanger arranged externally to the housing;

wherein the first heat exchanger is structured and arranged to cool the dielectric fluid and the second heat exchanger is structured and arranged to cool a cooling fluid which flow in the cooling fluid circuit; and wherein the second heat exchanger is a cooling fluid radiator of the internal combustion engine.

13. The cooling arrangement according to claim 2, wherein at least one of the dielectric fluid and the cooling fluid has a plurality of phases.

14. The cooling arrangement according to claim 5, wherein the at least one guiding element is a separate component from the housing and is coupled thereto.

15. The cooling arrangement according to claim 5, wherein the at least one guiding element is integrally provided with the housing.

16. The cooling arrangement according to claim 5, wherein the at least one guiding element includes a plurality of guiding elements disposed on a plurality of sides of the housing.

17. The cooling arrangement according to claim 7, wherein the at least one inlet opening is arranged at least partially below a level of the dielectric fluid.

18. The cooling arrangement according to claim 7, wherein the at least one outlet opening is a nozzle and is arranged above the at least one inlet opening relative to a level of the dielectric fluid.

19. A cooling arrangement, comprising:
a fluid-tight housing structured to retain a dielectric fluid; and
a slosh cooled power electronics system arranged in the housing such that the power electronics system is in heat-transferring contact with the dielectric fluid and the dielectric fluid is flowable around the power electronics system when the dielectric fluid is sloshed about within the housing via acceleration forces acting on the housing of the cooling arrangement.

20. The cooling arrangement according to claim 19, further comprising a cooling fluid circuit through which a cooling fluid is flowable, the cooling fluid circuit including a first heat exchanger, a second heat exchanger, and a cooling fluid pump, wherein:
the first heat exchanger is arranged within the housing and through which the cooling fluid is flowable to indirectly cool the dielectric fluid; and
the second heat exchanger is arranged outside of the housing and is structured to cool the cooling fluid.

\* \* \* \* \*